(12) United States Patent
Liu et al.

(10) Patent No.: US 12,543,546 B2
(45) Date of Patent: Feb. 3, 2026

(54) PACKAGE STRUCTURE AND METHOD FOR FABRICATING THE SAME

(71) Applicant: Taiwan Semiconductor Manufacturing Company, Ltd., Hsinchu (TW)

(72) Inventors: Hsiang-Wei Liu, Tainan (TW); Chung-Kuang Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 433 days.

(21) Appl. No.: 18/192,679

(22) Filed: Mar. 30, 2023

(65) Prior Publication Data

US 2024/0128120 A1  Apr. 18, 2024

Related U.S. Application Data

(60) Provisional application No. 63/415,638, filed on Oct. 12, 2022.

(51) Int. Cl.
| | | |
|---|---|---|
| *H01L 21/768* | (2006.01) | |
| *H01L 21/302* | (2006.01) | |
| *H01L 21/48* | (2006.01) | |
| *H01L 21/56* | (2006.01) | |
| *H01L 21/762* | (2006.01) | |
| *H01L 23/538* | (2006.01) | |

(52) U.S. Cl.
CPC ...... *H01L 21/76837* (2013.01); *H01L 21/302* (2013.01); *H01L 21/486* (2013.01); *H01L 21/56* (2013.01); *H01L 21/76224* (2013.01); *H01L 21/76871* (2013.01); *H01L 21/76877* (2013.01); *H01L 23/5389* (2013.01)

(58) Field of Classification Search
CPC ............ H01L 21/76837; H01L 21/302; H01L 21/76224; H01L 21/76877
See application file for complete search history.

(56) References Cited

U.S. PATENT DOCUMENTS

| | | | |
|---|---|---|---|
| 8,629,040 B2 * | 1/2014 | Chang | H01L 21/02653 438/700 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,054,164 B1 * | 6/2015 | Jezewski | H01L 23/5226 |
| 9,064,879 B2 | 6/2015 | Hung et al. | |
| 9,111,949 B2 | 8/2015 | Yu et al. | |
| 9,123,656 B1 * | 9/2015 | Hsieh | H01L 21/3086 |

(Continued)

*Primary Examiner* — Bac H Au
(74) *Attorney, Agent, or Firm* — JCIPRNET

(57) ABSTRACT

A package structure and a manufacturing method thereof are disclosed. The structure includes at least one semiconductor die, a redistribution layer disposed on the at least one semiconductor die, and connectors there-between. The connectors are disposed between the at least one semiconductor die and the redistribution layer, and electrically connect the at least one semiconductor die and the redistribution layer. The redistribution layer includes a dielectric layer with an opening and a metallic pattern layer disposed on the dielectric layer, and the metallic pattern layer includes a metallic via located inside the opening with a dielectric spacer surrounding the metallic via and located between the metallic via and the opening.

20 Claims, 13 Drawing Sheets

(56) References Cited

U.S. PATENT DOCUMENTS

| | | | |
|---|---|---|---|
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,431,297 B2 * | 8/2016 | Wu | H01L 21/76811 |
| 9,496,189 B2 | 11/2016 | Yu et al. | |
| 10,249,496 B2 * | 4/2019 | Shu | H01L 21/0337 |
| 10,867,793 B2 * | 12/2020 | Liu | H01L 24/02 |
| 10,867,804 B2 * | 12/2020 | Su | H01L 21/0337 |
| 2014/0191409 A1 * | 7/2014 | Lao | H01L 21/76813 |
| | | | 257/774 |
| 2016/0035571 A1 * | 2/2016 | Chang | H01L 21/02282 |
| | | | 438/703 |
| 2017/0200641 A1 * | 7/2017 | Tsai | H01L 21/32133 |
| 2017/0330761 A1 * | 11/2017 | Chawla | H01L 23/53295 |
| 2019/0206725 A1 * | 7/2019 | Chu | H01L 21/76897 |
| 2021/0090997 A1 * | 3/2021 | Haran | H01L 21/76802 |
| 2022/0084976 A1 * | 3/2022 | Huang | H01L 24/32 |
| 2022/0102143 A1 * | 3/2022 | Chen | H01L 21/76877 |

\* cited by examiner

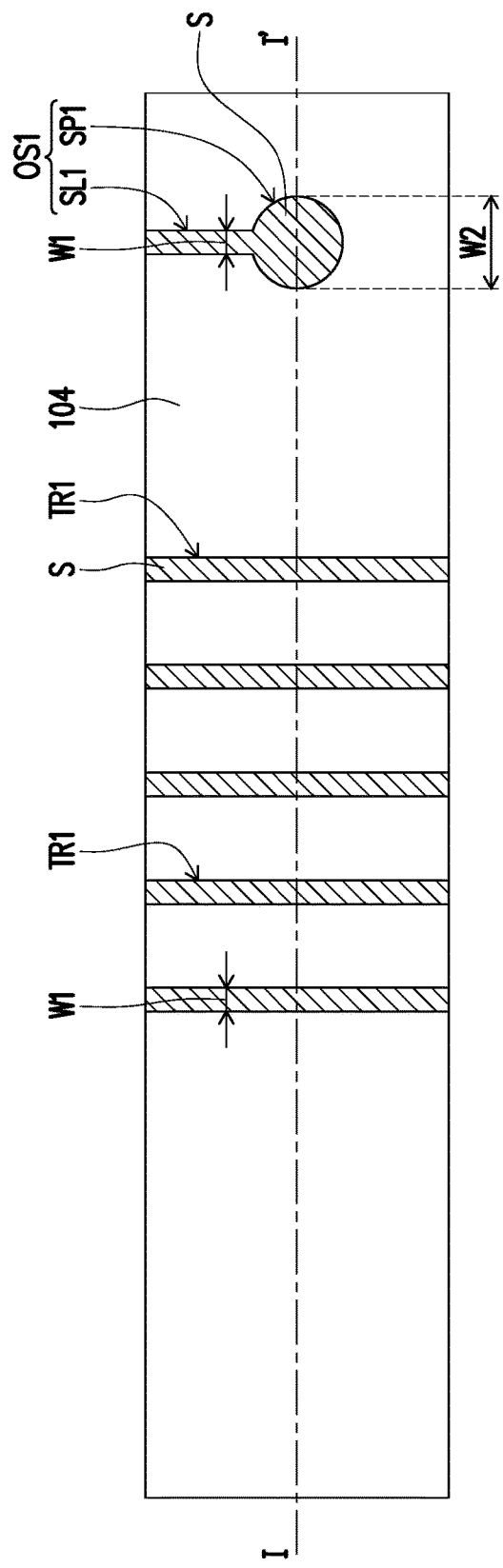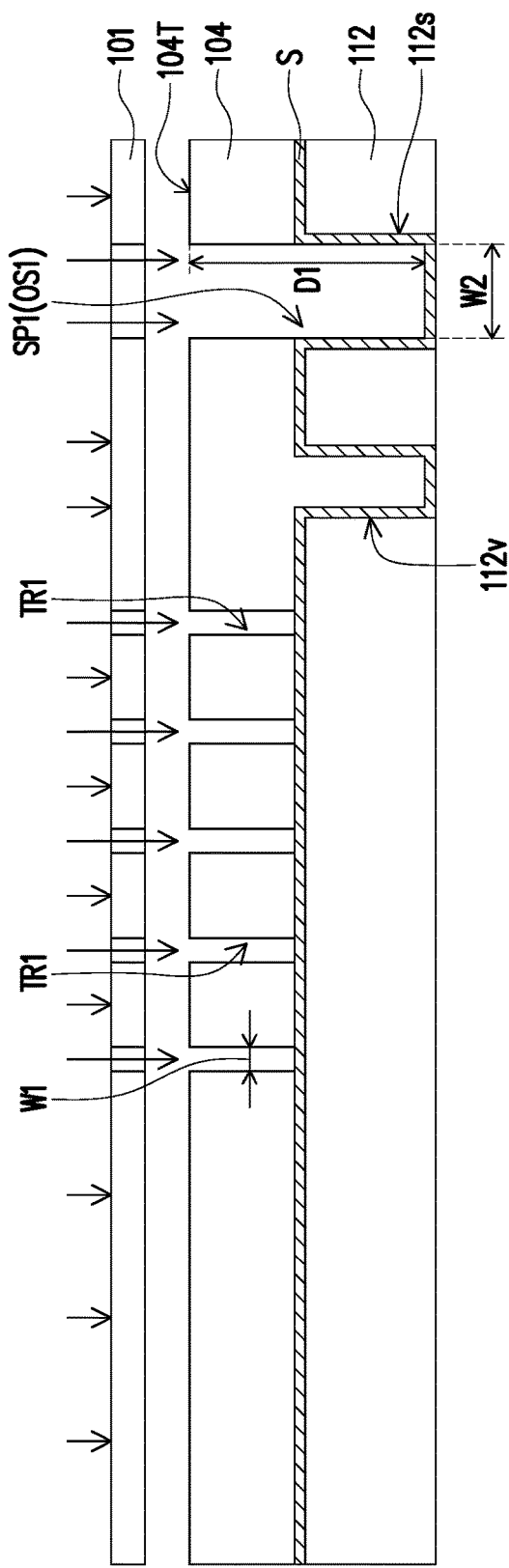
FIG. 1A
FIG. 1B

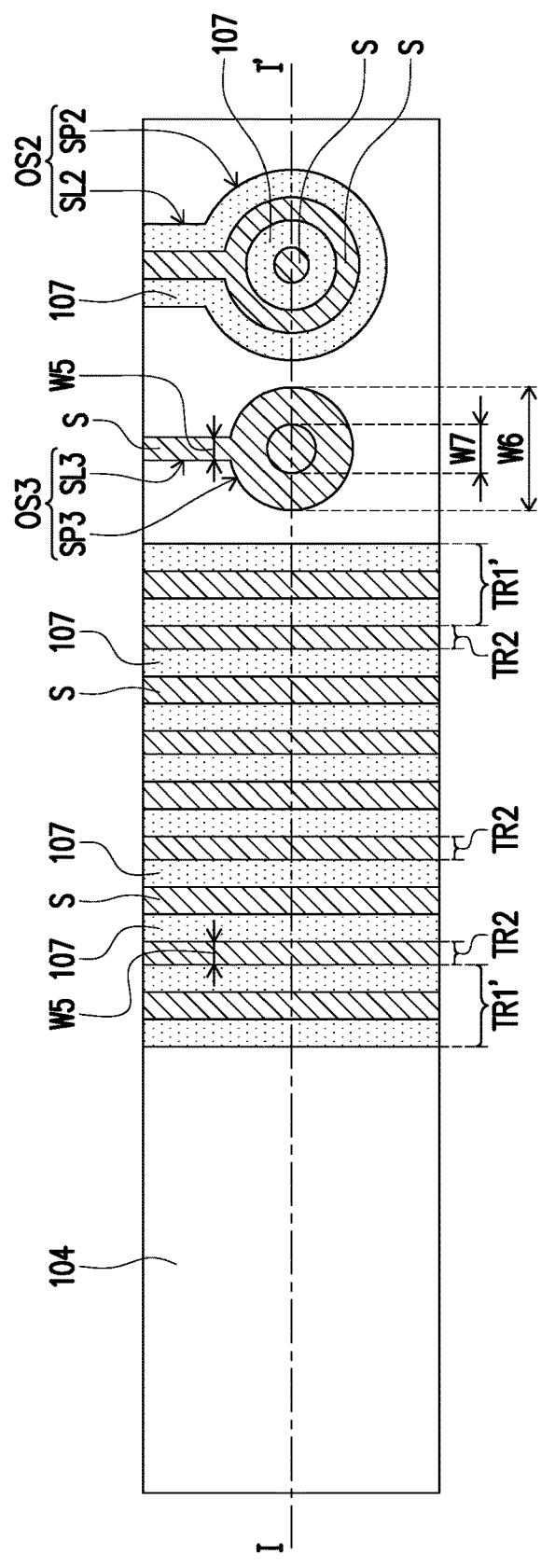
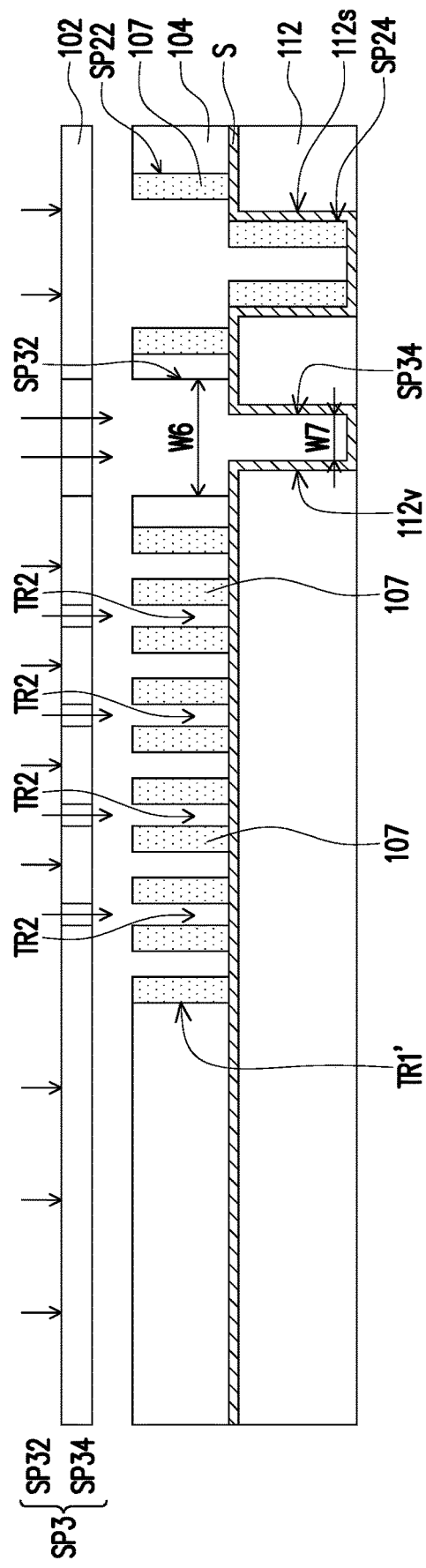
FIG. 5A
FIG. 5B

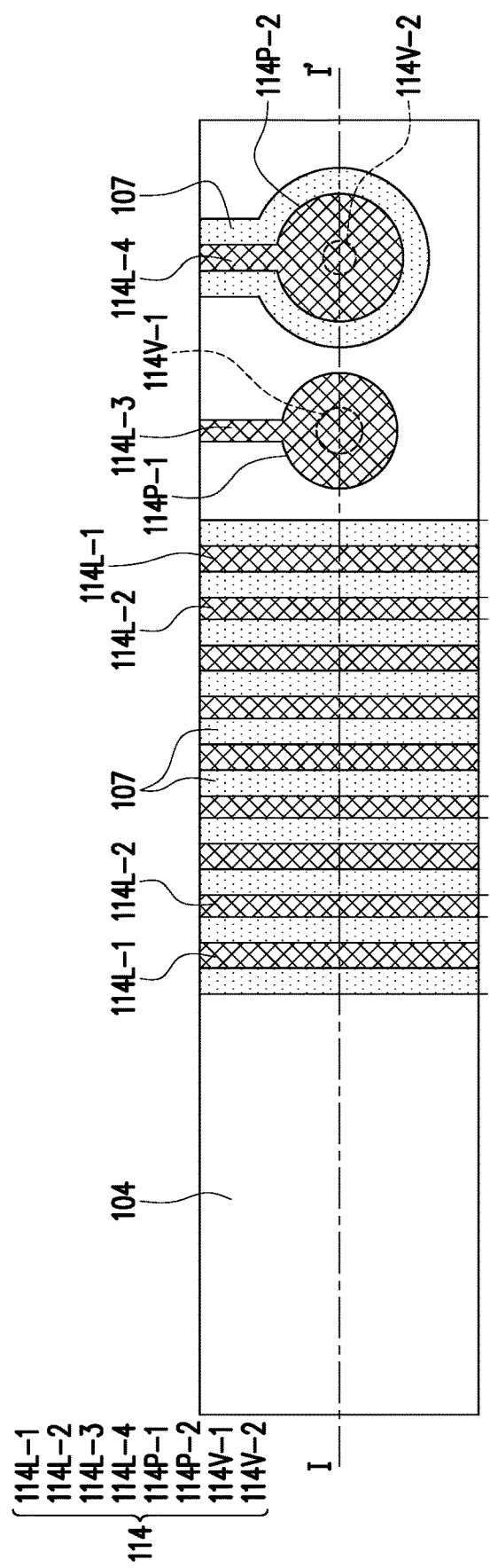
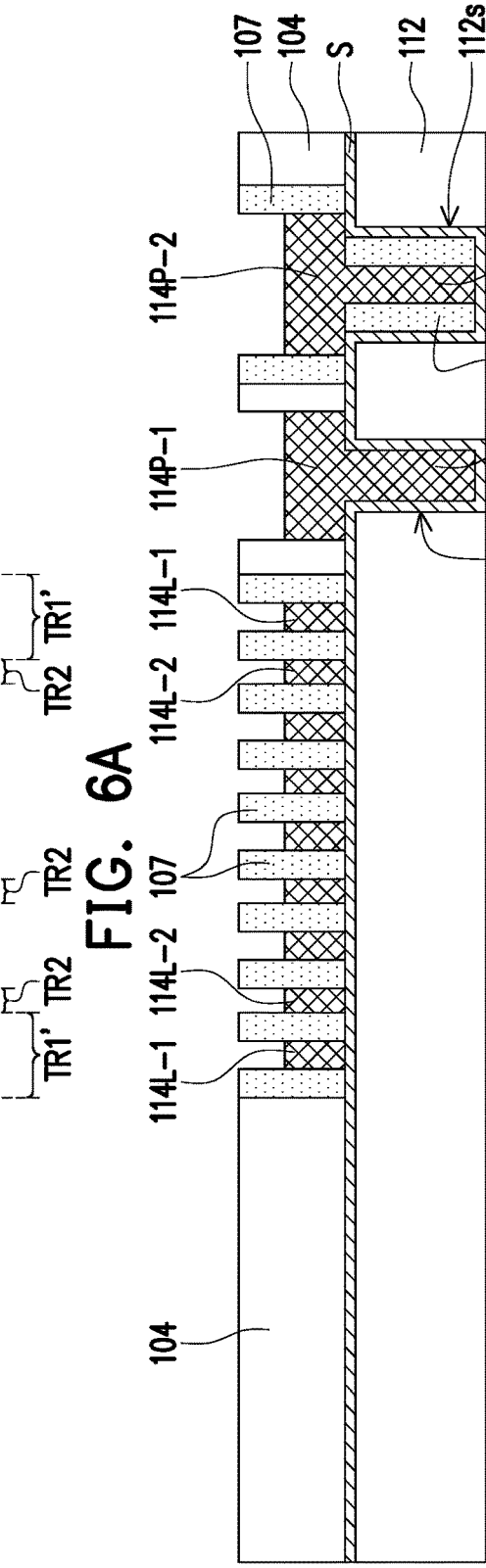
FIG. 6A
FIG. 6B

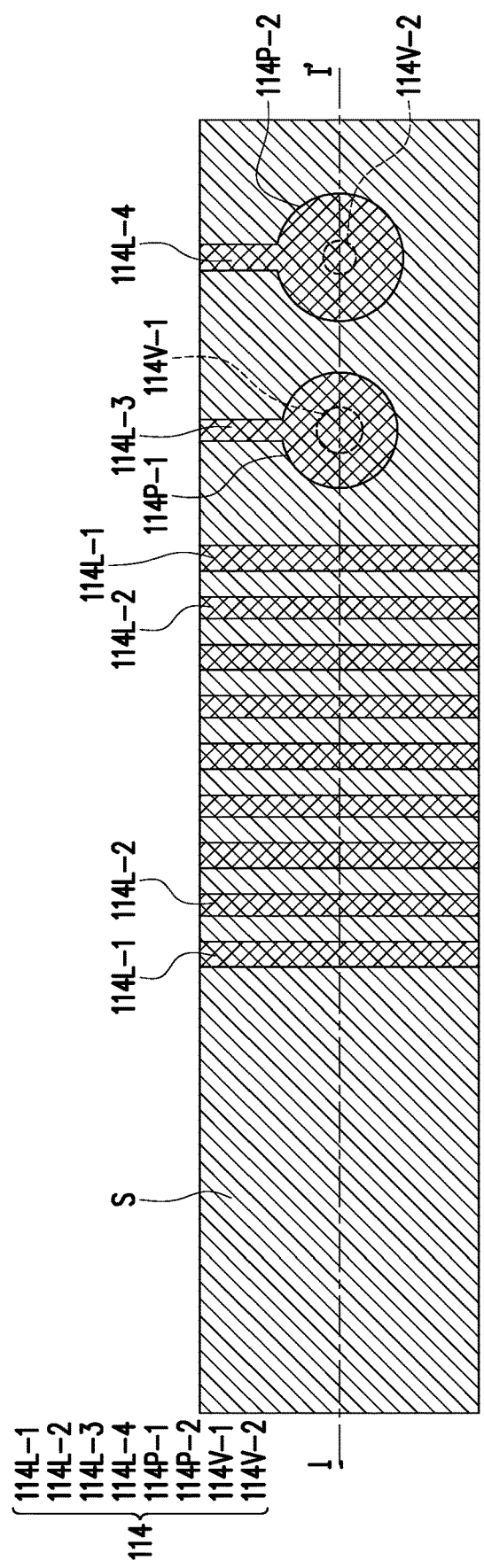
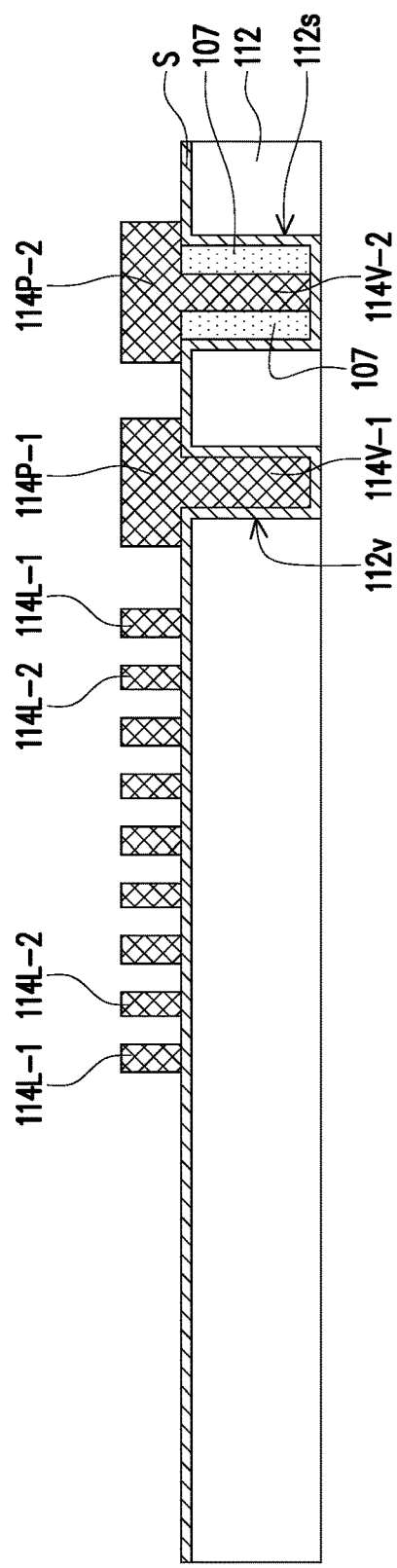
FIG. 7A
FIG. 7B

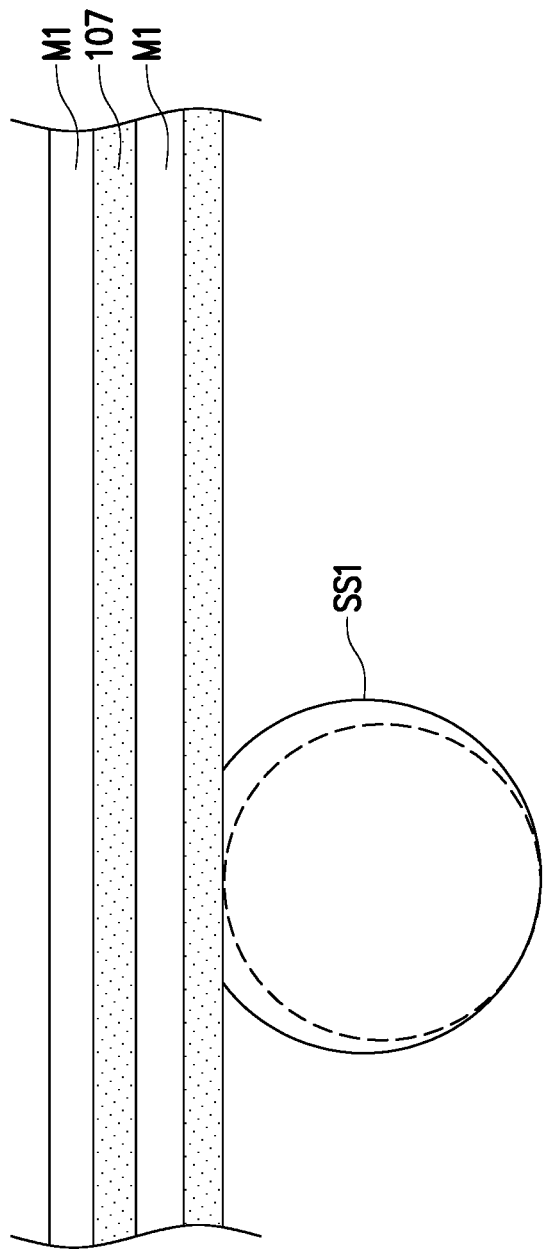

PACKAGE STRUCTURE AND METHOD FOR FABRICATING THE SAME

CROSS-REFERENCE TO RELATED APPLICATION

This application claims the priority benefit of U.S. provisional application Ser. No. 63/415,638, filed on Oct. 12, 2022. The entirety of the above-mentioned patent application is hereby incorporated by reference herein and made a part of this specification.

BACKGROUND

To further achieve higher integration density of semiconductor components, the semiconductor industry is endeavoring in developing new technologies to fabricate the redistribution circuit structure with compact design metallic wiring layer.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

FIG. 1A through FIG. 8B are schematic views illustrating a process flow for fabricating a redistribution layer in accordance with some embodiments of the present disclosure.

FIG. 10 is a schematic view showing the relative locations of the spacer(s) and the metallic patterns in accordance with some embodiments of the present disclosure.

DETAILED DESCRIPTION

Figure 2A:
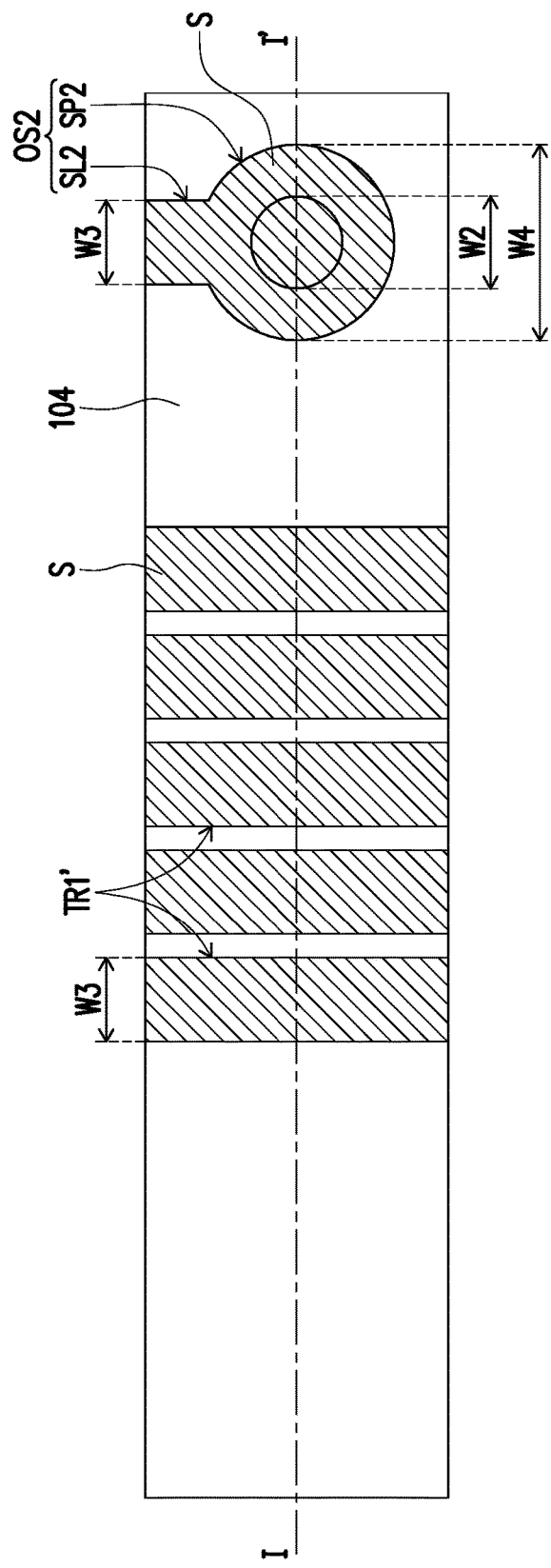

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 8B are schematic views illustrating a process flow for fabricating a redistribution layer in accordance with some embodiments of the present disclosure. FIGS. 1A, 2A, 3A, 4A, 5A, 6A, 7A and 8A are schematic top views of the redistribution layer, while FIGS. 1B, 2B, 3B, 4B, 5B, 6B, 7B and 8B are schematic cross-sectional view of the redistribution layer along cross-sectional line I-I'.

As illustrated in FIG. 1A and FIG. 1B, in some embodiments, a dielectric layer 112 is formed with openings 112$v$ and 112$s$. In some embodiments, the dielectric layer 112 includes a photo-sensitive patternable material. For example, the formation of the dielectric layer 112 involves forming a dielectric material layer (not shown) and patterning the dielectric material layer through a photolithography process and a developing process to form the openings 112$v$ and 112$s$ in the patterned dielectric layer 112. In some embodiments, the material of the dielectric layer 112 includes polyimide, benzocyclobutene (BCB), polybenzoxazole (PBO), or any other suitable resin-based dielectric material. In one embodiment, the material of the dielectric layer 112 includes photosensitive polyimide. The dielectric layer 112, for example, may be formed by suitable fabrication techniques such as spin-on coating, chemical vapor deposition (CVD) such as plasma-enhanced chemical vapor deposition (PECVD), or the like.

In some embodiments, referring to FIG. 1A and FIG. 1B, a seed layer S is formed blanketly over the dielectric layer 112 covering the exposed surfaces of the openings 112$v$ and 112$s$ (including the sidewalls and bottom surfaces of the openings 112$v$ and 112$s$). In some embodiments, the seed layer S may include or be a titanium/copper (Ti/Cu) composite layer, and the seed layer S function as the seed for metal plating process for the formation of metallic wiring layer 114 in the following processes.

In some embodiments, referring to FIG. 1A and FIG. 1B, after the seed layer S is formed, a photoresist layer 104 is formed on the seed layer S and filling into the openings of the dielectric layer 112. In some embodiments, a first exposure process is performed using a first photomask 101 with a first pattern. In some embodiments, the photoresist layer 104 is a positive-type photoresist layer, and the exposed portions of the photoresist layer 104 are removed during the development process. Through the first exposure process and the development process, the photoresist layer 104 is formed with first trench openings TR1 and the opening OS1. From FIG. 1A, it is seen that the first trenches TR1 are parallel strip-shaped trenches with a width W1 exposing the underlying seed layer S. Also, as seen in FIG. 1A and FIG. 1B, the opening OS1 includes a round opening SP1 joined with a strip-shaped trench SL1, and the location of the round opening SP1 (having a diameter W2) is overlapped with the location of the opening 112s, and the opening SP1 extends from the top surface 104T of the photoresist layer 104 to the seed layer S at the bottom of the opening 112s with a depth D1. In some embodiments, the depth D1 of the opening SP1 is larger than the depth of the first trenches TR1, and the width W2 of the opening SP1 is larger than the width (critical dimension) W1 of the first trenches TR1. In some embodiments, the width W1 ranges from 0.2 microns to about 1.0 micron, and the width W2 ranges from 0.4 microns to about 5 microns. In FIG. 1B, the opening 112v is filled up by the photoresist layer 104.

Figure 2B:
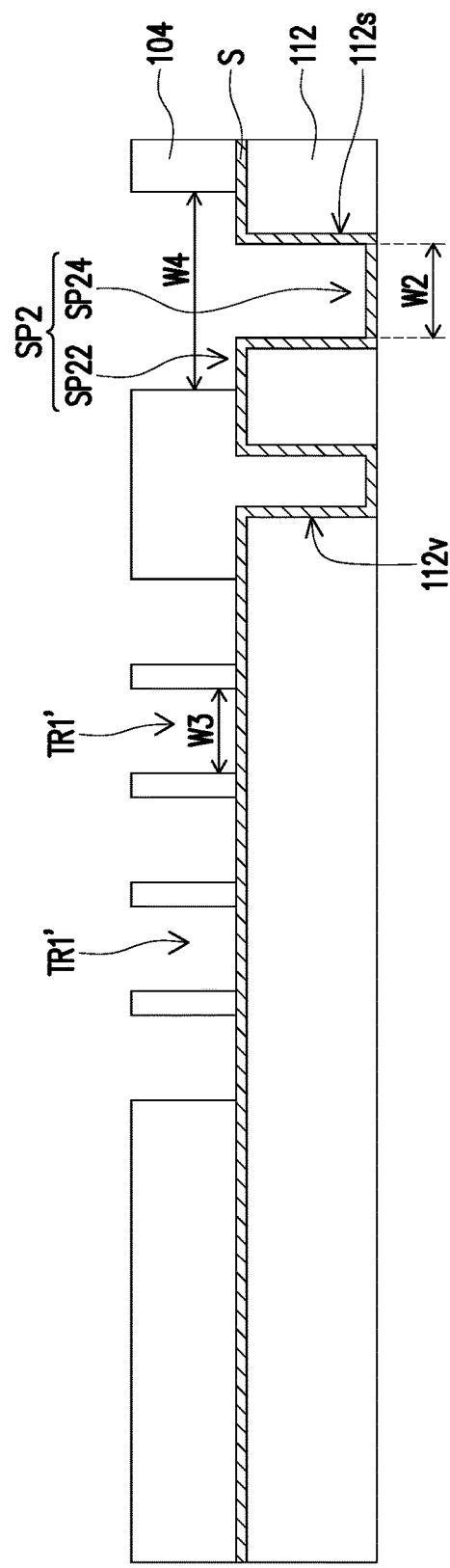

As illustrated in FIG. 2A and FIG. 2B, an ashing process is performed to the photoresist layer 104 to partially remove the photoresist layer 104. After the ashing process, the trenches TR1 and the opening OS1 are enlarged to become the first trenches TR1' with the width W3 and the opening OS2. As seen in FIG. 2A and FIG. 2B, the opening OS2 includes the enlarged round opening SP2 (with a diameter W4) joined with the widened trench SL2, and the location of the round opening SP2 is overlapped with the location of the opening 112s. As seen in FIG. 2B, the upper part SP22 of the opening SP2 extending from the top surface of the photoresist layer 104 to the seed layer S at the top of the dielectric layer 112 has the width W4 and the power part SP24 of the opening SP2 extending from the top to the bottom of the opening 112s has the with W2, and the opening SP2 is a dual damascene opening with a wider upper opening SP22 and a smaller lower via opening SP24. In some embodiments, the ashing process includes performing a plasma etching process to laterally remove the photoresist layer 104. Such lateral etching process widens the trenches and the openings uniformly. In some embodiments, the ratio of W3/W1 ranges from 2 to 3 or is about 2.5. In some embodiments, the ratio of W4/W2 ranges from 2 to 3 or is about 2.5. In some embodiments, the ratio of W3/W1 is about the same as the ratio of W4/W2.

Figure 3A:
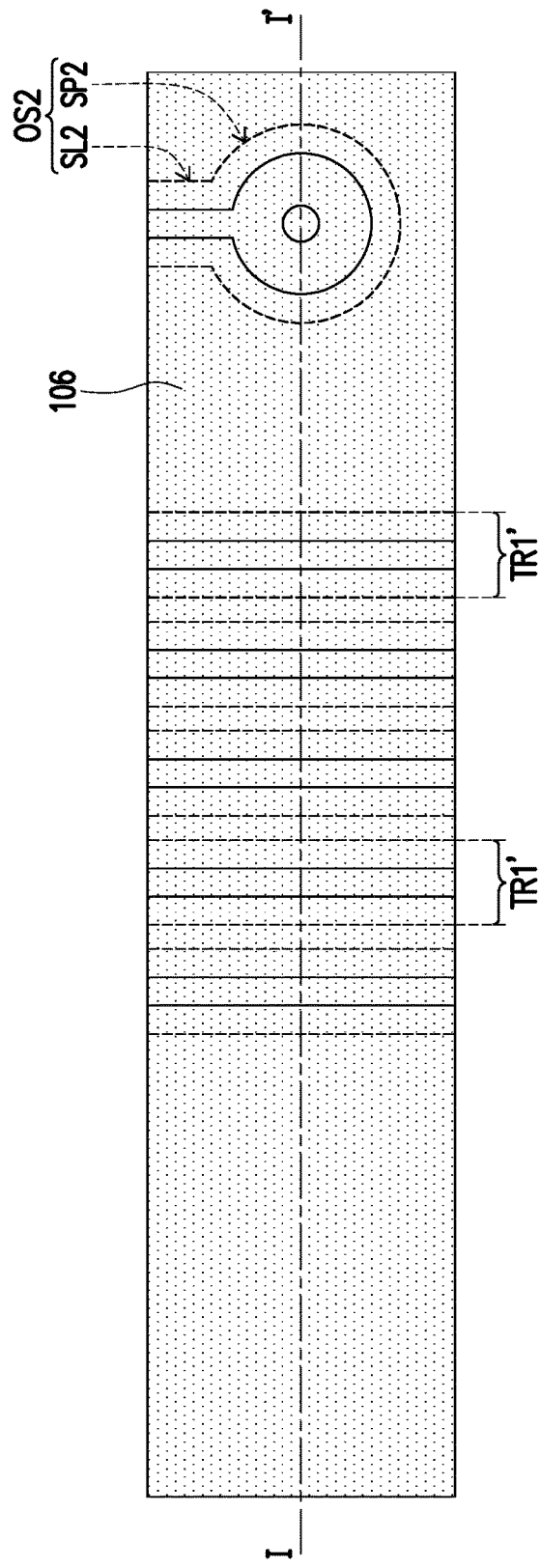
Figure 3B:
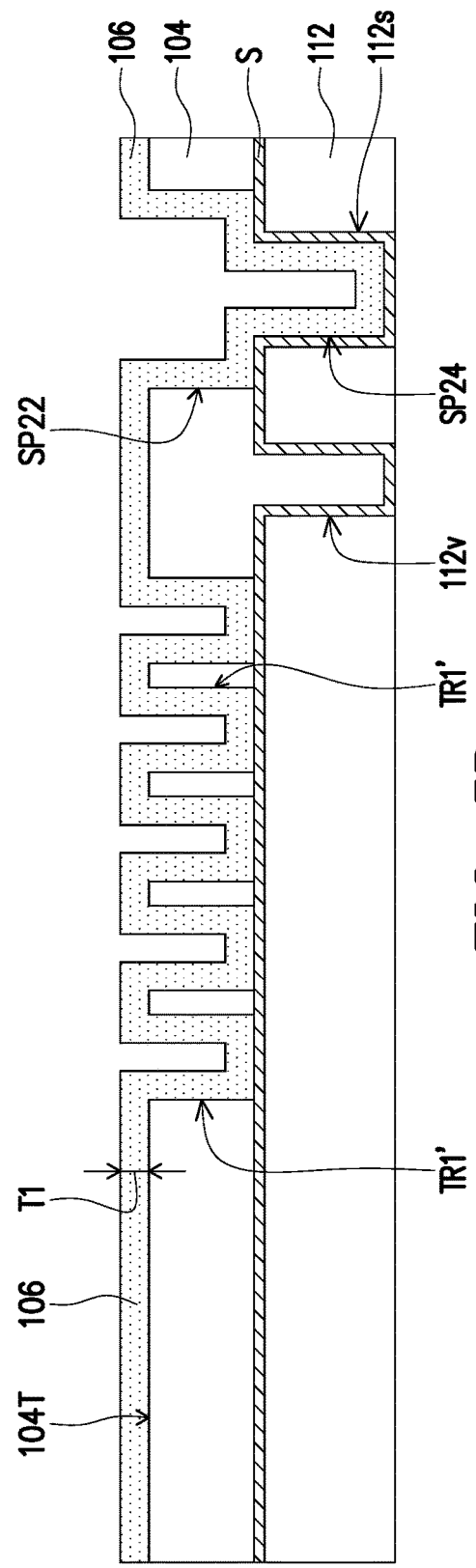

Referring to FIG. 3A and FIG. 3B, after performing the ashing process, a spacer material layer 106 is formed over the dielectric layer 112 and on the photoresist layer 104. In some embodiments, the spacer material layer 106 is conformally formed over the widened first trenches TR1' and the opening OS2 and over the photoresist layer 104. As seen in FIG. 3B, the spacer material layer 106 not only covers the top surface 104T of the photoresist layer 104 but also covers the sidewalls and bottom surfaces of the widened trenches TR1' and covers the sidewalls and bottom surface of the opening OS2. In some embodiments, the spacer material layer 106 is formed with a uniform thickness T1 ranging from about 0.3 microns to about 1 micron. It is understood that the lateral etching width of the ashing process may be finely tuned and time-controlled and may be adjusted according to the thickness of the later formed spacer material layer.

In some embodiments, the dielectric material of the spacer material layer 106 includes silicon nitride, titanium nitride, titanium oxide, or a combination thereof. In some embodiments, the material of the spacer material layer 106 includes silicon nitride, aluminum oxide, silicon oxide or a combination thereof. In some embodiments, the spacer material layer 106 is formed by a deposition process such as chemical vapor deposition (CVD) or atomic layer deposition (ALD).

Figure 4A:
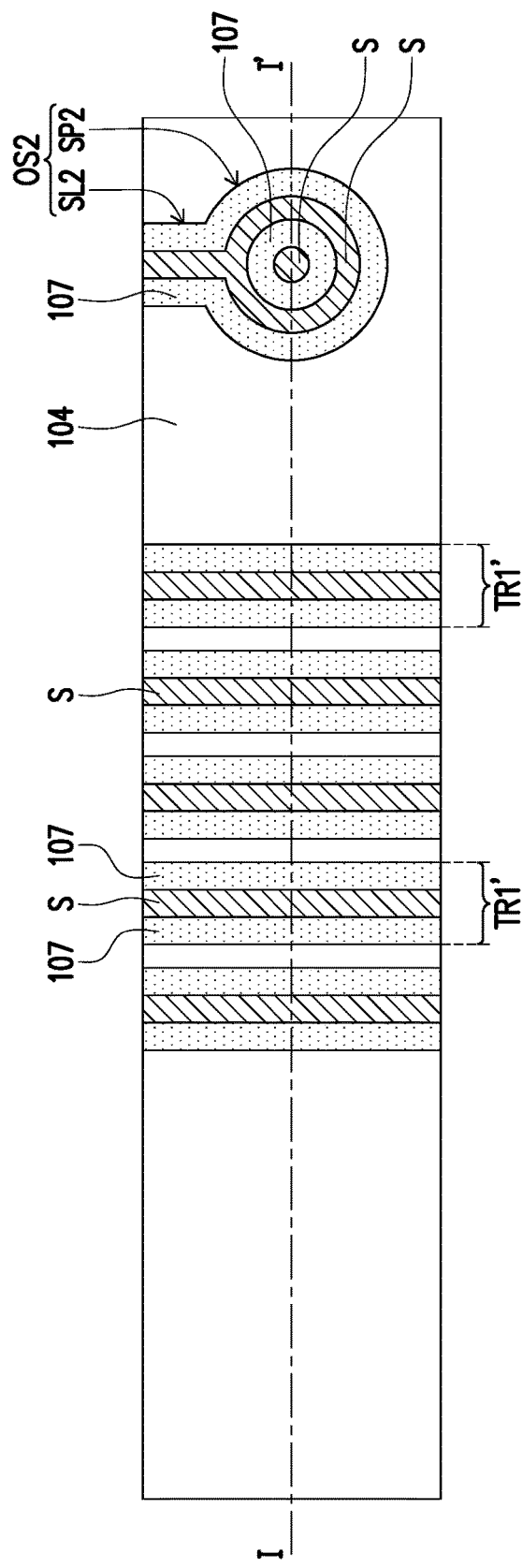
Figure 4B:
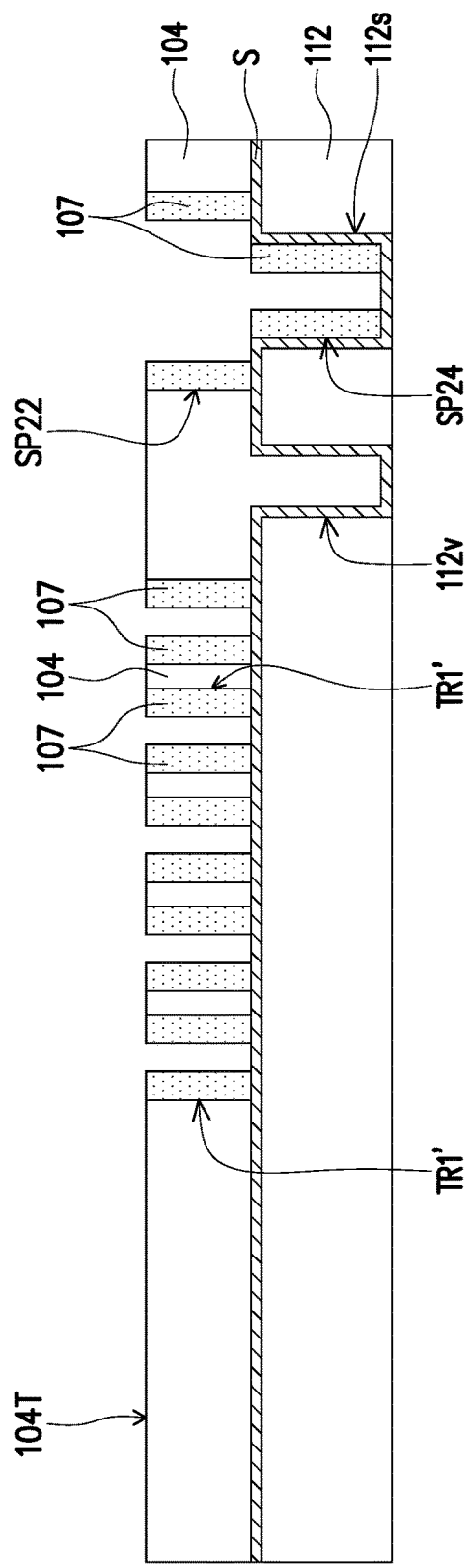

Referring FIG. 4A and FIG. 4B, an etching back process is performed to partially remove the spacer material layer 106 to form spacers 107. In some embodiments, the etching back process specifically removes the spacer material layer 106 on the planar surfaces rather the removing the spacer material layer 106 on the sidewalls. In some embodiments, the etching back process includes a dry etching process performed with an angle to selectively remove the spacer material layer 106 located on the top surface 104T of the photoresist layer 104 and located on the planar surfaces of the seed layer. As seen in FIG. 4A and FIG. 4B, the spacers 107 are formed the sidewalls of the trenches TR1', and on the sidewalls of the opening OS2 (on the sidewalls of the trench SL2 and the opening SP2). In FIG. 4B, the spacers 107 are located on the sidewalls of the upper opening SP22 and the lower opening SP24. Considering the first trench TR1' with the sidewall spacers 107, the remained void space of the first trench TR1' may have a width equal to (W3−2*T1). Similarly, the void space of the upper opening SP22 may have a width (W4−2*T1), and the void space of the lower opening SP24 may have a width (W2−2*T1).

Referring to FIG. 5A and FIG. 5B, a second exposure process is performed using a second photomask 102 with a second pattern different from the first pattern. In some embodiments, during the second exposure process, portions of the photoresist layer 104 sandwiched between the spacers 107 (the photoresist layer located between the trenches TR1') are exposed, and a portion of the photoresist layer 104 above the opening 112v is exposed as well. Through the second exposure process and the development process, second trench openings TR2 are formed with a width W5 between the spacers 107 and the locations of the second trench openings TR2 are between the locations of the widened first trench openings TR1'. In some embodiments, opening OS3 is formed in the photoresist layer 104, and the opening OS3 includes a strip-shaped trench SL3 joined with a round opening SP3 with a width (diameter) W6. As seen in FIG. 5B, the opening SP3 is also a dual damascene opening having a wider upper pad opening SP32 (with the width W6) and a narrower lower via opening SP34 (with a width W7). As the opening OS3 or SP3 is formed after the formation of the spacers 107, there is no spacers located within the opening OS3 or SP3. On the other hand, in some embodiments, the spacers 107 are located on the sidewalls of the upper pad opening SP22, and the spacers 107 are located on the sidewalls of the lower via opening SP24. Depending on the profile of the opening, it is possible that the spacers 107 on the sidewalls of the upper pad opening SP22 are separate from the spacers 107 on the sidewalls of the lower via opening SP24.

Referring to FIG. 6A and FIG. 6B, with the presence of the spacers 107, using the seed layer S exposed by the trenches TR1' and TR2 and the openings OS2 and OS3 as the seed, a metallic material is formed by performing a plating process to form a metallic pattern layer 114. In some embodiments, the metallic material fills into the trenches TR1' and TR2 to form metallic line patterns 114L-1 and 114L-2 respectively. In some embodiments, the metallic material fills into the opening OS3 to form metallic line pattern 114L-3, metallic pad 114P-1 and metallic via 114V-1, and the metallic material fills into the opening OS2 to form metallic line pattern 114L-4, metallic pad 114P-2 and metallic via 114V-2. In some embodiments, the metallic pattern layer 114 includes the metallic line patterns 114L-1, 114L-2, 114L-3, 114L-4, the metallic pads 114P-1, 114P-2 and metallic vias 114V-1, 114V-2. In some embodiments, the metallic material includes copper or copper alloys. In some embodiments, the metallic material includes aluminum, titanium, copper, nickel, tungsten, silver, gold, combinations or alloys thereof. In certain embodiments, the metallic pattern layer 114 is part of the redistribution layer.

In some embodiments, the metallic line patterns 114L-1 and 114L-4 have a width equal to (W3−2*T1), and the metallic line patterns 114L-2 and 114L-3 have the width W5. In some embodiments, the metallic pad 114P-2 and metallic via 114V-2 have the width (W4−2*T1) and the width (W2−2*T1), the metallic pad 114P-1 have the width W6 and the metallic via 114V-1 have the width W7.

Referring to FIG. 7A and FIG. 7B, the remained photoresist layer 104 and the spacers 107 are removed to expose the underlying seed layer S. In some embodiments, the remained photoresist layer 104 is removed through a stripping process using a resist stripping solution. In some embodiments, the spacers 107 are removed by performing a wet etching process, a dry etching process or a combination thereof. In some embodiments, the remained photoresist layer 104 and the spacers 107 are removed by performing the same etching process.

Figure 8A:
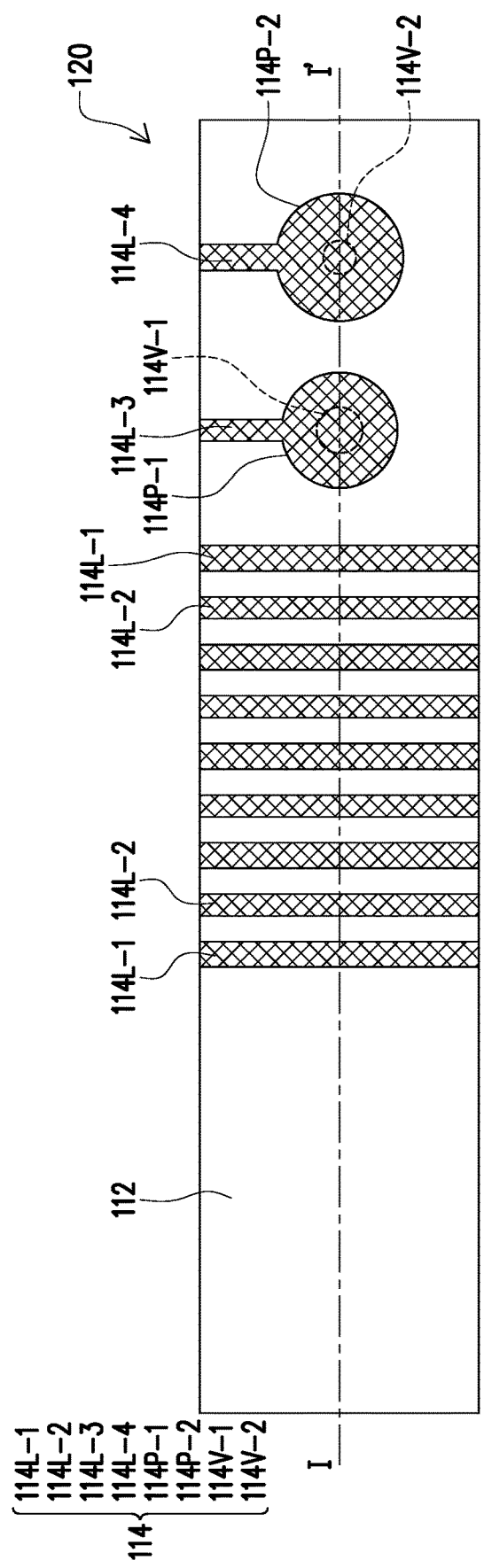
Figure 8B:
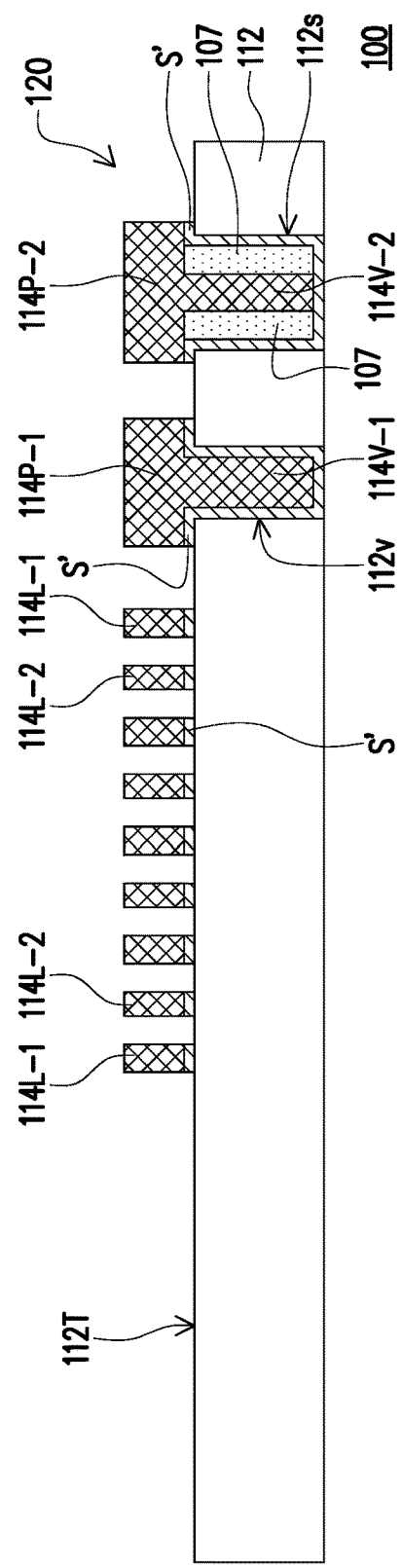

Referring to FIG. 8A and FIG. 8B, using the metallic pattern layer 114 as the masks, the exposed seed layer S is removed to form seed patterns S' under the metallic pattern layer 114, so that the top surface 112T of the dielectric layer 112 is exposed. A redistribution layer 120 including the dielectric layer 112 and the remained seed pattern S' and the metallic pattern layer 114 as the conductive metallic routing layer located on the dielectric layer 112 is formed. In some embodiments, the exposed seed layer S is removed by performing a dry etching process. As seen in FIG. 8B, in some embodiments, the seed pattern S' is located inside the opening 112v and located between the metallic pad 114P-1 and the metallic via 114V-1 and the dielectric layer 112. As seen in FIG. 8B, in some embodiments, the seed pattern S' is located inside the opening 112s and located between the spacer 107, the metallic pad 114P-2 and the metallic via 114V-2 and the dielectric layer 112. The spacer 107 located within the opening 112s is sandwiched between the metallic via 114V-2 and the seed pattern S', and the metallic pad 114P-2 is located on the metallic via 114V-2 and the spacer 107. In some embodiments, the spacer 107 may be shaped like a dielectric ring around the metallic via 114V-2 within the opening 112s, while the bottom of the metallic via 114V-2 is exposed from the spacer ring 107 and is in contact with the seed pattern S'. Due to the existence of the ring-shaped spacer 107 inside the opening 112s, the size of the metallic via 114V-2 is reduced and becomes smaller.

In some embodiments, together with the underlying seed pattern S', the metallic pattern layer 114 include line patterns 114L-1, 114L-2, 114L-3, 114L-4 functioning as circuit lines extending horizontally for routing, and metallic pads 114P-1, 114P-2 and metallic vias 114V-1, 114V-2 extending vertically through the above and below dielectric layers to establish electrical connection between the redistribution layers of the redistribution structure.

For illustration purposes, one redistribution later is described, the dielectric layer 112 is illustrated as a single dielectric layer and the metallic pattern layer 114 is illustrated to include the metallic line patterns and metallic pads on the dielectric layer 112 and metallic vias embedded in the dielectric layer 112. Nevertheless, from the perspective of the manufacturing process, the above describe processes may be repeated several times depending on the product design and the redistribution structure may include multiple redistribution layers with several layers of redistribution metallic patterns sandwiched by several dielectric layers.

Referring to FIG. 10, with the presence of the spacers 107, even the exposure is misaligned or over-etching occurs, the opening SS1 may be formed or etched beyond the predetermined span (represented by the dashed line) but will be limited by the nearby spacer 107, the later formed metallic pad filled in the opening SS1 will not extends beyond the location of the spacer 107 and will not be in direct contact with the metallic line Ml. Hence, the tolerance of the exposure alignment and the process window become larger, and shorting of the wirings may be prevented, thus improving the reliability of the package structure.

As described in the previous paragraphs, using two different photomasks with different patterns through two exposure processes, trenches/openings with larger dimensions are firstly formed and then narrowed by the later formed spacers therein. As the exposure and development process may have limitations for small critical dimensions, the process steps as described above employing the spacer material in two-staged exposure and development processes sufficiently prevent the unsuccessful exposure or the failure caused by misalignment, and patterns of small critical dimensions can be faithfully transferred to the underlying layer(s).

The processes as described in the embodiments of the disclosure include forming the small line patterns as trenches in the first exposure process, widening the trenches, filling spacers in the widened trenches and forming other small line patterns as trenches between the adjacent spacers by the second exposure process. Compared with the processes forming the small trenches at the same exposure process, the manufacturing processes as described in the embodiments of the disclosure ensure the fidelity of the patterns with larger process window and exposure tolerance and also allow the same amount or more of line patterns to be formed in a given area on the dielectric layer. As there is limitation for the minimum linewidth (or critical dimension) in the exposure/development process, the method provided in the embodiments of the present disclosure utilizes the spacers formed inside the trenches or openings to reduce/narrow down the sizes or dimensions of the trenches or openings of the patterns, so that patterns of small dimensions can be formed. Also, through the formation of the spacers inside the openings or trenches, more trenches or openings may be formed between adjacent spacers through another exposure process, leading to more line patterns of smaller dimensions and higher routing intensity in a predetermined region.

In some embodiments, the above manufacturing process (es) may be applicable for forming metallization routing patterns for redistribution circuit structure or any routing or interconnecting structure. Particularly, some or all metallization routing patterns for redistribution circuit structure may be fabricated through the above manufacturing process (es), so that the redistribution layer may be formed with more line patterns of smaller dimensions and higher routing intensity. Further, the reliability of the redistribution circuit structure(s) or either fan-in or fan-out routing structure(s) is improved.

Figure 9A:
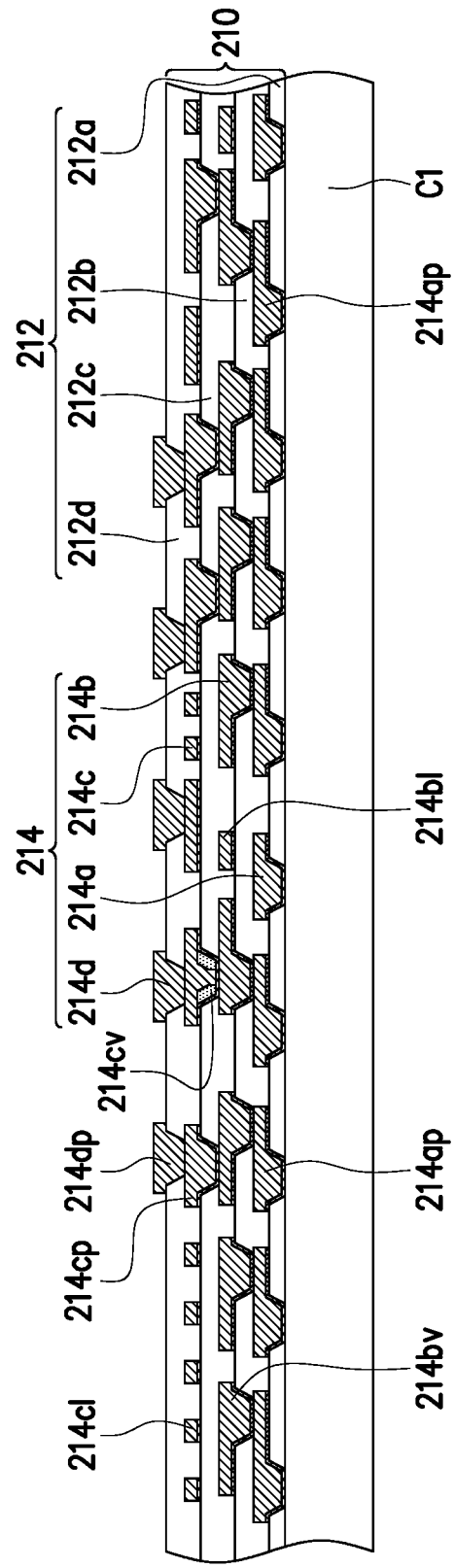
FIG. 9A through FIG. 9C are cross-sectional views schematically illustrating a process flow for fabricating a package structure in accordance with some embodiments of the present disclosure.
Figure 9B:
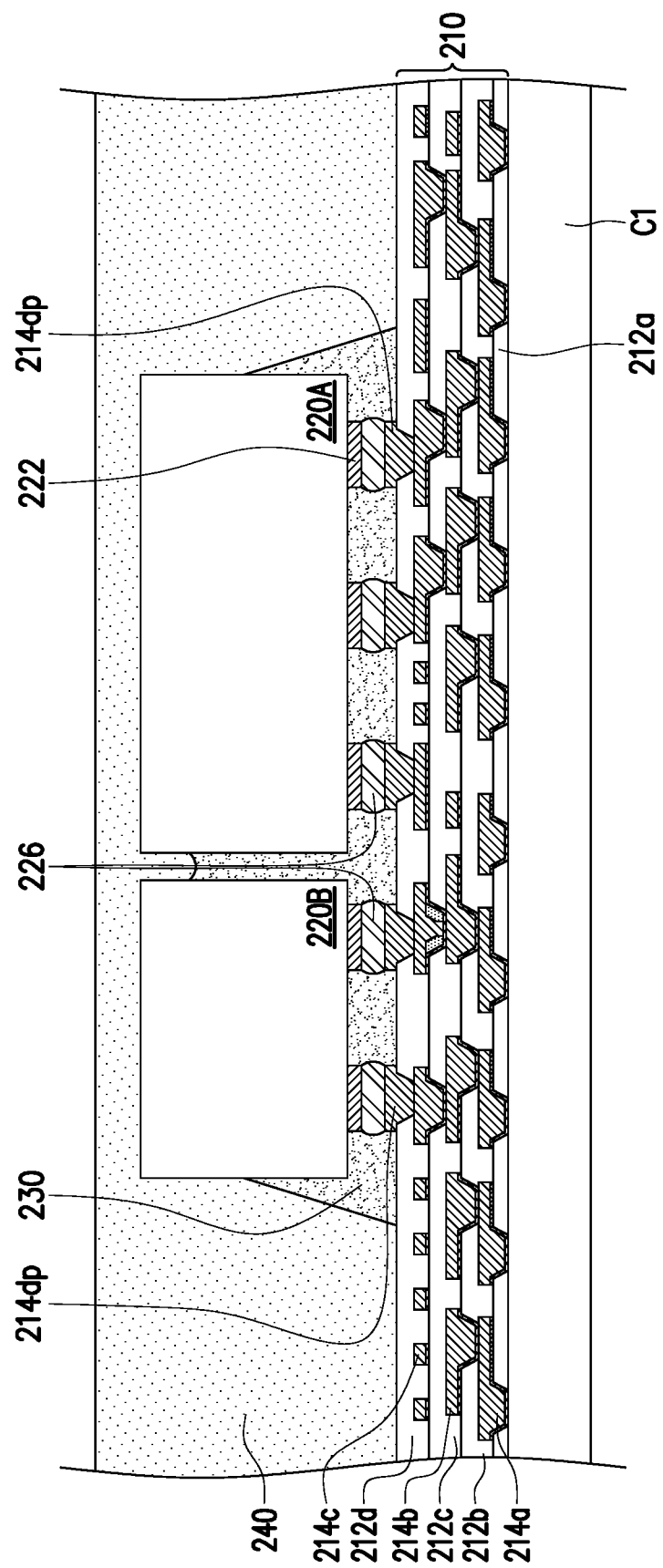
Figure 9C:
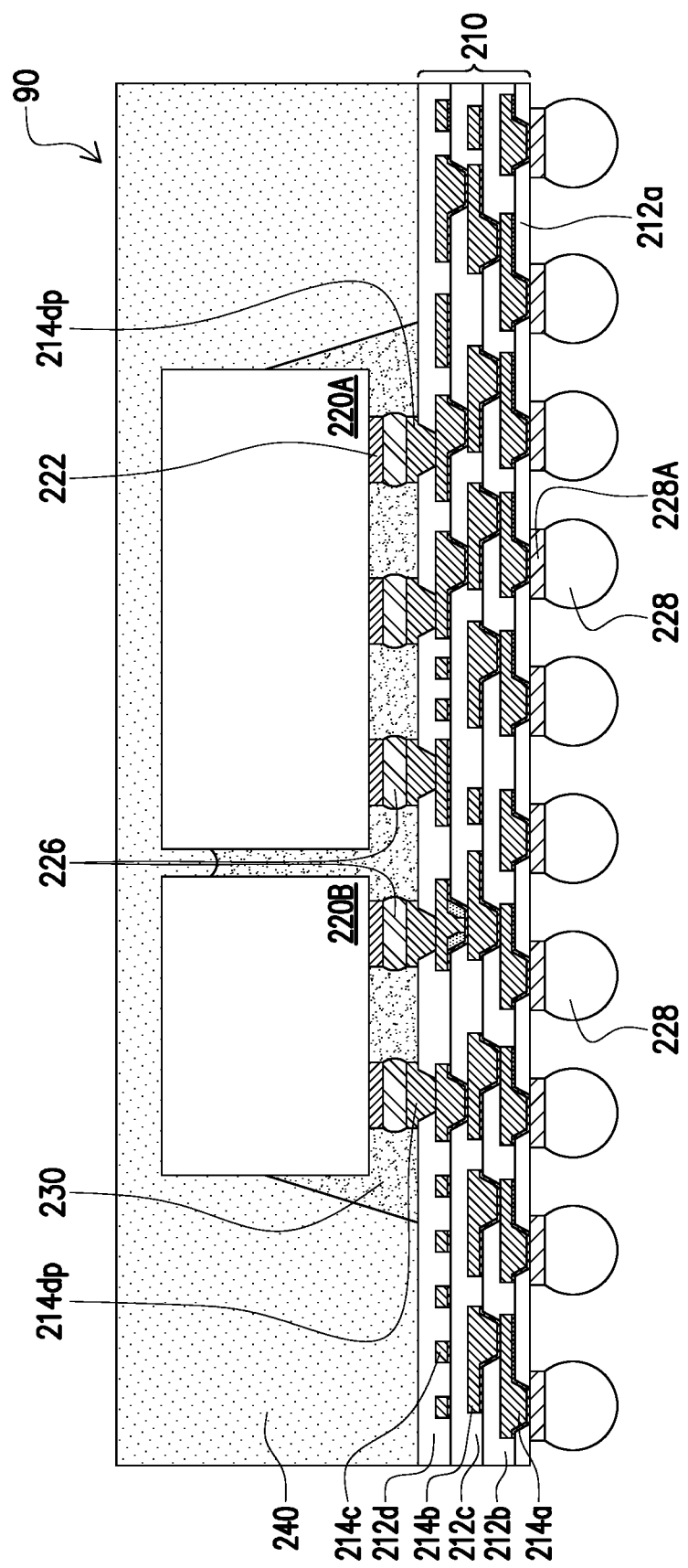
Figure 9D:
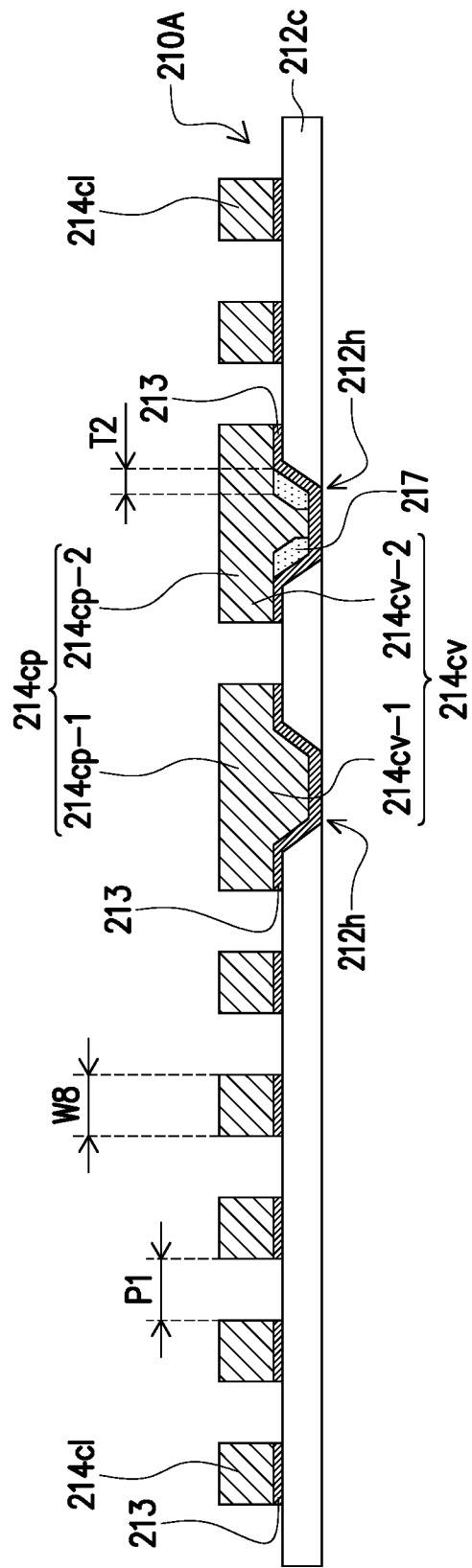
FIG. 9D is a schematic cross-sectional view showing a redistribution layer in accordance with some embodiments of the present disclosure.

FIG. 9A through FIG. 9C are schematic cross-sectional views illustrating a process flow for fabricating a package structure in accordance with some embodiments of the present disclosure. FIG. 9D is a schematic cross-sectional view showing a redistribution layer in accordance with some embodiments of the present disclosure.

Referring to FIG. 9A, a carrier C1 is provided and a redistribution circuit structure 210 is formed over the carrier C. In some embodiments, the carrier C1 is a temporary carrier. In some embodiments, the carrier C1 includes a reconstructed wafer or a semiconductor wafer (e.g., a silicon wafer). In some embodiments, the redistribution circuit structure 210 includes stacked dielectric layers 212a, 212b, 212c, 212d (together as the dielectric layers 212) and metallic wiring layers 214a, 214b, 214c, 214d (together as the wiring layers 214) sandwiched between the stacked dielectric layers 212. The dielectric layers 212 and the metallic wiring layers 214 are sequentially formed and stacked over the carrier C1.

In some embodiments, the metallic wiring layers 214a, 214b, 214c, 214d include metal or metallic materials, such as aluminum, titanium, copper, nickel, tungsten, silver, gold, combinations or alloys thereof. In certain embodiments, metallic wiring layers 214a, 214b, 214c, 214d are formed by, for example, electroplating, deposition, and/or photolithography and etching. In some embodiments, the materials of the dielectric layers 212a, 212b, 212c, 212d include polyimide, BCB, PBO, or any other suitable resin-based dielectric materials. For example, the dielectric layer 212 may be formed by suitable fabrication techniques such as spin-on coating, or CVD. It should be noted that the number of layers of dielectric layers or the wiring layers in the redistribution circuit structure are merely for illustrative purposes, and the disclosure is not limited thereto.

In FIG. 9A, in some embodiments, the metallic wiring layer 214a includes metallic pads 214ap functioning as bump pads. In some embodiments, the metallic wiring layer 214d includes metallic pads 214dp functioning as contact pads. In some embodiments, the metallic wiring layer 214b includes metallic routing lines 214b1 and vias 214bv. In some embodiments, the metallic wiring layer 214c includes metallic routing lines 214c1, metallic pads 214cp and vias 214cv. It is noted that either metallic wiring layer may be fabricated using the manufacturing process described above. Herein, the metallic wiring layer 214c is formed following the manufacturing process described above as an example to show the method disclosed in this disclosure is compatible and applicable for any package structures formed with redistribution layer.

Referring to FIG. 9D, the redistribution layer 210A includes the dielectric layer 212c and the metallic wiring layer 214c formed on the dielectric layer 212c. In some embodiments, the metallic wiring layer 214c includes metallic routing lines 214c1 located on the dielectric layer 212c, metallic pads 214cp-1, 214cp-2 (generally as pads 214cp) and metallic vias 214cv-1, 214cv-2 (generally as vias 214cv). As seen in FIG. 9D, together with the seed layer 213, the metallic pad 214cp-1 and the metallic via 214cv-1 are formed inside the opening 212h with the seed layer 213 sandwiched there-between (without the spacer), so that the size of the via 214cv-1 is about the same as the size of the opening 212h (minus the thickness of the seed layer 213). In some embodiments, the seed layer 213 is sandwiched between the opening 212h of the dielectric layer 212c and the metallic pad 214cp-2 and the metallic via 214cv-2, and the spacer 217 that physically contacts the metallic via 214cv-2 is sandwiched between the metallic via 214cv-2 and the seed layer 213 inside the opening 212h of the dielectric layer 212c. In some embodiments, for the spacer 217 with a thickness T2, the size (diameter) of the metallic via 214cv-2 is about the size of the opening 212h minus the thickness T2 of the spacer 217 (also minus the thickness of the seed layer 213). That is, with the existence of the spacer 217, the size of the metallic via may be further shrunk. In some embodiments, the thickness T2 of the spacer 217 ranges from about 0.3 microns to about 1 micron, the metallic lines 214c1 have a width W8 ranging between 0.5 microns to 2 microns, and a spacing P1 ranging from about 0.5 microns to about 2 microns.

Referring to FIG. 9B, in some embodiments, after forming the redistribution circuit structure 210, semiconductor dies 220A and 220B are mounted onto and bonded to the redistribution circuit structure 210. In some embodiments, the semiconductor dies 220A and 220B are different types of dies or perform different functions. In some embodiments, the semiconductor die 220A or 220B includes a logic die, a memory die, or a system on a chip (SoC) die, an application-specific integrated circuit (ASIC) die, etc.). In some embodiments, the semiconductor die 220A includes a SoC die, and the semiconductor die 220B includes a memory die (such as, dynamic random access memory (DRAM) die, static random access memory (SRAM) die, hybrid memory cube (HMC), high bandwidth memory (HBM) die).

In some embodiments, as seen in FIG. 9B, the semiconductor dies 220A, 220B are bonded to and electrically connected to the redistribution circuit structure 210 via connectors 226 located between bond pads 222 of the dies 220A and 220B and the metallic pads 214dp. In some embodiments, the connectors 226 include metal pillars, metal pillars with solder caps, bumps, micro bumps, or combinations thereof. The semiconductor dies 220A and 220B are electrically connected with the redistribution circuit structure 210. In FIG. 9B, in some embodiments, an underfill 230 is formed between the dies 220A, 220B and the redistribution circuit structure 210, surrounding the die connectors 226. In some embodiments, the underfill 230 is formed by a capillary flow process after the dies 220A and 220B are bonded to the redistribution circuit structure 210.

In some embodiments, as seen in FIG. 9B, after forming the underfill 230, an encapsulant 240 is formed over the semiconductor dies 220A, 220B and the underfill 230. In some embodiments, the insulating material of the encapsulant 240 includes epoxy resins and fillers.

Later, referring to FIG. 9C, the carrier C is removed to expose the metallic pads 214ap from the dielectric layer 212a, and conductive terminals 228 are respectively formed on the metallic pads 214ap with under-ball metallurgy (UBM) patterns 228A there-between. in some embodiments, the conductive terminals 228 include controlled collapse chip connection (c4) bumps, solder balls, ball grid array (BGA) bumps, or the like. Afterwards, a singulation process is performed and individual packages 90 (one is shown) are formed.

In some embodiments, the above semiconductor packages 90 may be manufactured as large-scale Integrated Fan-Out (InFO) packages, with better reliability and yield. Furthermore, whilst the process is currently being illustrated for InFO packages, such as large scale InFO packages, the disclosure is not limited to the package structures shown in the drawings, and other types of wafer level packages or multi-die stacking packages are also meant to be covered by the present disclosure and to fall within the scope of the appended claims.

In accordance with some other embodiments of the disclosure, the manufacturing process utilizes two different photomasks with different patterns through two exposure processes, trenches/openings with larger dimensions are firstly formed and then narrowed by the later formed spacers therein. Due to the linewidth limitation in the exposure and development processes, the manufacturing processes as described above are suitable for forming patterns of small critical dimensions, by employing the spacer material in two-staged exposure and development processes, fine patterns can be formed and the existence of the spacer during the plating process can sufficiently prevent the unsuccessful exposure or the failure caused by misalignment.

In accordance with some other embodiments of the disclosure, a package structure is disclosed. The structure includes at least one semiconductor die, a redistribution layer disposed on the at least one semiconductor die, and connectors there-between. The connectors are disposed between the at least one semiconductor die and the redistribution layer, and electrically connect the at least one semiconductor die and the redistribution layer. The redistribution layer includes a dielectric layer with an opening and a metallic pattern layer disposed on the dielectric layer, and the metallic pattern layer includes a metallic via located inside the opening with a dielectric spacer surrounding the metallic via and located between the metallic via and the opening.

In accordance with some embodiments of the disclosure, a method for fabricating a package structure is disclosed. A dielectric layer with an opening is formed, and a photoresist layer is formed on the dielectric layer. A first exposure process is performed and first trenches and a first opening are formed in the photoresist layer. A location of the first opening is overlapped with a location of the opening. An ashing process is performed to the photoresist layer to widened the first trenches and enlarge the first opening. Spacers are formed on sidewalls of the widened first trenches and the enlarged first opening. A second exposure process is performed to remove the photoresist layer between the adjacent spacers and the widened first trenches to form second trenches in the photoresist layer between the adjacent spacers and the widened first trenches. A metal pattern layer is formed between the spacers in the widened first trenches, the second trenches and the enlarged first opening. The spacers and the photoresist layer are removed to expose a top surface of the dielectric layer.

In accordance with some embodiments of the disclosure, a method for fabricating a package structure is disclosed. A dielectric layer with a first opening and a second opening is formed. A photoresist layer is formed on the dielectric layer filling into the first and second openings. A first exposure process is performed, and first trenches and a third opening are formed in the photoresist layer. A location of the third opening is overlapped with a location of the first opening. An ashing process is performed to the photoresist layer to widened the first trenches and enlarge the third opening. Spacers are formed on sidewalls of the widened first trenches and the enlarged third opening. A second exposure process is performed to remove the photoresist layer between the adjacent spacers and the widened first trenches to form second trenches in the photoresist layer between the adjacent spacers and the widened first trenches, and a fourth opening is formed in the photoresist layer. A metal pattern layer is formed between the spacers in the widened first trenches, the second trenches, the enlarged third opening and the fourth opening. The spacers and the photoresist layer are removed to expose a top surface of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a package structure, comprising:
    forming a dielectric layer with an opening;
    forming a photoresist layer on the dielectric layer;
    performing a first exposure and development process and forming first trenches and a first opening in the photoresist layer, wherein a location of the first opening is overlapped with a location of the opening;
    performing an ashing process to the photoresist layer to widened the first trenches and enlarge the first opening;
    forming spacers on sidewalls of the opening, the widened first trenches and the enlarged first opening;
    performing a second exposure and development process to remove the photoresist layer between adjacent spacers and between the widened first trenches to form second trenches in the photoresist layer between the adjacent spacers;
    forming a metal pattern layer between the spacers in the widened first trenches, in the second trenches and in the enlarged first opening and the opening; and
    removing the spacers and the photoresist layer to expose a top surface of the dielectric layer without removing the spacers on the sidewalls of the opening.

2. The method as claimed in claim 1, wherein forming spacers on sidewalls of the opening, the widened first trenches and the enlarged first opening includes:
    forming a spacer material layer over the photoresist layer and conformally covering the widened first trenches, the opening and the enlarged first opening; and
    performing an etching back process to remove the spacer material layer located above the photoresist layer.

3. The method as claimed in claim 1, further comprising forming a seed layer on the dielectric layer and covering the opening of the dielectric layer before forming the photoresist layer.

4. The method as claimed in claim 3, wherein forming a metal pattern layer between the spacers in the widened first trenches, in the second trenches and in the enlarged first opening and the opening includes performing a plating process using the seed layer exposed from the widened first trenches, the second trenches, the opening and the enlarged first opening as a seed.

5. The method as claimed in claim 4, wherein forming a metal pattern layer between the spacers in the widened first trenches, in the second trenches and in the enlarged first opening and the opening includes forming first line patterns on the exposed seed layer in the widened first trenches, forming second line patterns on the exposed seed layer in the second trenches, and forming a metallic pad and a metallic via on the exposed seed layer in the enlarged first opening and the opening.

6. The method as claimed in claim 5, further comprising removing the seed layer not covered by the first and second line patterns and the metallic pad and the metallic via.

7. The method as claimed in claim 5, wherein the metallic pad in the enlarged first opening is formed to cover the metallic via in the opening and cover the spacers on the sidewalls of the openings.

8. A method for fabricating a package structure, comprising:
    forming a dielectric layer with a first opening and a second opening;

forming a photoresist layer on the dielectric layer filling into the first and second openings;
performing a first exposure and development process and forming first trenches and a third opening in the photoresist layer, wherein a location of the third opening is overlapped with a location of the first opening;
performing an ashing process to the photoresist layer to widened the first trenches and enlarge the third opening;
forming spacers on sidewalls of the widened first trenches and the enlarged third opening;
performing a second exposure and development process to remove the photoresist layer between adjacent spacers and between the widened first trenches to form second trenches in the photoresist layer between the adjacent spacers and forming a fourth opening in the photoresist layer;
forming a metal pattern layer filling between the spacers in the widened first trenches, in the second trenches, in the enlarged third opening and in the fourth opening; and
removing the spacers and the photoresist layer to expose a top surface of the dielectric layer.

9. The method as claimed in claim 8, wherein forming spacers on sidewalls of the widened first trenches and the enlarged third opening includes:
forming a spacer material layer over the photoresist layer and conformally covering the widened first trenches and the enlarged third opening; and
performing an etching back process to remove the spacer material layer located above the photoresist layer.

10. The method as claimed in claim 8, wherein the second exposure and development process is performed after forming the spacers, and the fourth opening is formed in the photoresist layer after forming the spacers, so that there is no spacer formed in the fourth opening.

11. The method as claimed in claim 8, wherein the third opening is enlarged to have an upper larger opening in the photoresist layer and a lower smaller opening in the dielectric layer and the spacers are formed on sidewalls of the upper larger opening and the lower smaller opening.

12. The method as claimed in claim 11, wherein removing the spacers and the photoresist layer includes removing the spacers on the sidewalls of the upper larger opening without removing the spacers on the sidewalls of the lower smaller opening.

13. A method for forming a package structure, comprising:
providing a carrier;
forming a redistribution layer over the carrier, wherein forming the redistribution layer includes:
  forming a dielectric layer with a first opening and a second opening over the carrier;
  forming a seed layer over the dielectric layer conformally covering the first opening and the second opening;
  forming a photoresist layer with a third opening over the seed layer, wherein the photoresist layer is formed to fill up and cover the second opening and the third opening overlaps with and exposes the first opening and the seed layer around the first opening;
  forming a dielectric spacer material layer over the photoresist layer and conformally covering the third opening and the first opening;
  partially removing the dielectric spacer material layer to form a first spacer and a second spacer along sidewalls of the first opening and the third opening respectively;
  forming a fourth opening in the photoresist layer to expose the seed layer around the second opening, wherein the fourth opening overlaps with and exposes the second opening;
  forming a metallic material layer over the photoresist layer and the seed layer, filling into the first opening and the third opening to form a first metallic pattern filled in the first opening and the third opening and filling into the second opening and the fourth opening to form a second metallic pattern filled in the second opening and the fourth opening;
  removing the photoresist layer and removing the second spacer leaving the first spacer remained between the first metallic pattern and the seed layer inside the first opening; and
  removing the seed layer uncovered by the first and second metallic patterns;
providing at least one semiconductor die;
bonding the at least one semiconductor die to the redistribution layer; and
removing the carrier.

14. The method of claim 13, further comprising forming an encapsulant over the redistribution layer covering the at least one semiconductor die after bonding the at least one semiconductor die to the redistribution layer.

15. The method of claim 14, further comprising forming conductive terminals on the redistribution layer at another side of the redistribution layer opposite to where the at least one semiconductor die is bonded.

16. The method of claim 13, wherein after removing the seed layer uncovered by the first and second metallic patterns, the remained seed layer located in the first opening surrounds the first spacer and separates the first spacer from the dielectric layer.

17. The method of claim 16, wherein the first metallic pattern is formed with a first metallic via that is filled in the first opening and surrounded by the first spacer and a first metallic pad on the first spacer and the dielectric layer, and the first spacer is in contact with the first metallic via.

18. The method of claim 13, wherein the dielectric spacer material layer and the dielectric layer are formed of different materials.

19. The method of claim 13, wherein forming a photoresist layer with a third opening over the seed layer includes:
forming a photosensitive material layer;
patterning the photosensitive material layer to form a fifth opening and a trench;
performing a plasma etching process to partially remove the photosensitive material layer laterally from the fifth opening and from the trench to widen the trench and widen the fifth opening into the third opening so as to form the photoresist layer.

20. The method of claim 19, wherein a location of the fifth opening overlaps with a location of the first opening, and the fifth opening is formed to expose the seed layer around the first opening and expose the first opening.

* * * * *